REFLEX AMPLIFIER CIRCUIT WITH REDUCTION OF MINIMUM VOLUME CONTROL PLAY-THROUGH EFFECT

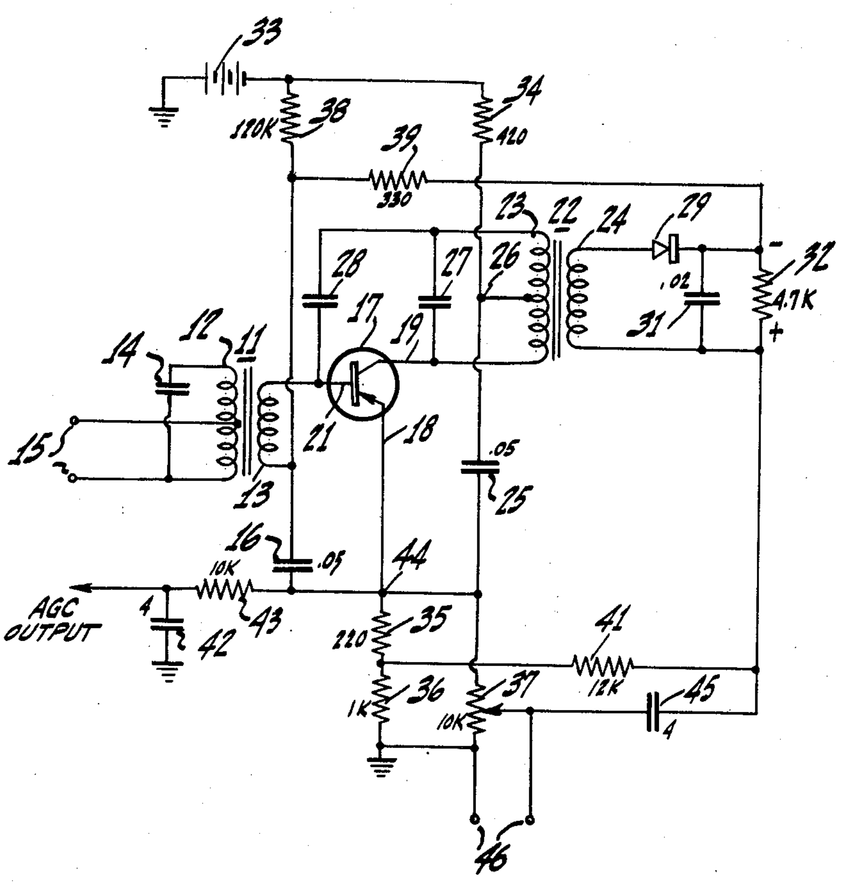
INVENTORS
HENRY M. KLEINMAN &
LOVA PLUS
BY Eugene M. Whitmore
ATTORNEY 3,144,611

Henry M. Kleinman and Lova Plus, Somerville, N.J., assignors to Radio Corporation of America, a corporation of Delaware Filed Sept. 14, 1960, Ser. No. 55,875
14 Claims. (Cl. 325—436)

This invention relates generally to electronic signal translating circuitry, and more particularly to reflex amplifier circuits for radio signal receivers.

By reason of their ability to simultaneously amplify electrical signals in divers frequency bands, reflex amplifiers of the type to which the present invention is directed are of importance in applications where reduced cost, compactness and lightweightness ore desired. For example, in portable superheterodyne radio receivers, a reflex amplifier stage can be used to amplify both the intermediate and audio frequency signals. However, reflex circuits as previously designed have not been entirely satisfactory since they have been characterized by such undesirable operational features as a residual volume, or "play through" effect, excessive loading of the detector circuit causing distortion, and overloading of the reflex amplifier stage at relatively low signal levels. The "play through" effect refers to the phenomenon of reflex circuitry when used in radio receivers where an audio output signal exists at the reflex amplifier output terminals although no audio signal is applied to the reflex circuit input terminals. This effect is due to the detection of strong carrier signals by the reflex amplifier device, and prevents the reduction of volume to a desired low level.

Accordingly, it is an object of the present invention to provide an improved reflex amplifier circuit.

Another object of the instant invention is to provide a relatively uncomplicated reflex amplifier circuit configuration especially suitable for use in a superheterodyne radio receiver.

A further object of this invention is to provide an improved reflex amplifier circuit substantially free of minimum volume control play-through effect.

A still further object of the present invention is to provide an improved reflex circuit concurrently amplifying the intermediate and audio frequency signals of a radio receiver, exhibiting no residual volume effect for minimum volume control setting, and developing an AGC potential substantially independent of variations in the volume control, and Another further object of the instant invention is to provide an improved reflex amplifier circuit for signal receivers exhibiting a high degree of immunity to audio distorton at high radio frequency signal input levels.

In accordance with the invention, these and other objects are attained by a reflex amplifier having an input circuit to which a first signal, such as an intermediate frequency signal, is applied coupled between the input electrodes of an amplifying device, and an output circuit coupled between the output electrodes of the device across which an amplified first signal is developed. A detector circuit is coupled to the output circuit to derive a second, or demodulated, signal from the amplified first signal. The second signal is applied between the input electrode and a movable contact on a variable impedance element connected between the output electrodes of the device. As the contact is moved in one direction, a portion of the impedance element is degeneratively included between the input electrodes of the device. Concurrently therewith, the magnitude of the remaining portion of the impedance element, across which an amplified second signal is developed for application to a utilization circuit, is reduced. Thus the second signal output applied to the utilization circut is controlled by the magnitude of degeneration and the magnitude of the impedance in the second signal output circuit.

The novel features which are considered characteristic of this invention are set forth with particularity in the appended claims. The invention itself, however, both as to its organization and method of operation as well as additional objects and advantages thereof, will best be understood from the following description when read in connection with the single figure of the accompanying drawing.

Referring now to the single figure, the reflex amplifier according to the present invention is shown as being composed of an input, or coupling transformer 11 having a primary winding 12 and a secondary winding 13. The primary winding 12 is shunted by a capacitor 14 to form a parallel resonant network tuned to a desired incoming high frequency signal applied to the input terminals 15 of the primary winding. To provide proper interstage loading, input terminals 15 are tapped across an intermediate portion of the primary winding. For descriptive purposes, the incoming high frequency signal will be assumed to be the intermediate frequency signal of a superheterodyne radio receiver, although it is to be clearly understood that the invention is not so limited and can be utilized in other applications desiring amplification of two separate frequency signals by a common amplifying device.

The incoming intermediate frequency signal is applied through an input circuit, which includes the inductively coupled primary and secondary windings of transformer 11 and an I.F. bypass capacitor 16 to the input electrodes of a semiconductor amplifying element, such as a p-n-p type junction transistor 17 having emitter, collector and base electrodes 18, 19, and 21, respectively. The emitter 18 and base 21 constitute the input electrodes of the transistor 17 while the collector 19 and emitter 18 constitute the output electrodes thereof. Inasmuch as the emitter is common to both the input and output electrodes, transistor 17 is operated in the common emitter configuration.

An output circuit, which includes a transformer 22 having primary and secondary windings 23 and 24, respectively, is connected through an I.F. bypass capacitor 25 and a tap 26 to the output electrodes of transistor 17. The tap 26 provides for proper loading of the transistor 17. A shunt capacitor 27 tunes the primary winding 23 to the same resonance as input transformer 11 and thereby providing for the development of an amplified intermediate frequency signal across output transformer 22.

To eliminate the possibility of oscillation due to internal positive feedback of the intermediate frequency signal through the collector to base junction capacitance of the transistor, a capacitor 28 may be connected in an external neutralization path which includes a portion of primary winding 23, between the collector 19 and base 21. The particular coupling of primary winding 23 to the transistor provides the proper signal phase reversal for the neutralization path, while capacitor 25 furnishes a suitable reference point for neutralization.

The amplified intermediate frequency signal is coupled through secondary winding 24 of transformer 22 to a detector circuit which includes a diode 29 and the parallel combination of a capacitor 31 and a resistor 32. The signal induced in secondary winding 24 is rectified by diode 29 and the time constant characteristic of capacitor 31 and resistor 32 filters out the carrier component of the rectified signal thereby developing a demodulated, or audio frequency, signal across resistor 32 corresponding to the envelope of the rectified signal.

Operating potentials are provided for transistor 17 from a direct current potential source such as a battery 33, the positive terminal of which may be at a common ground potential for the stage; as shown in the figure. The negative terminal of battery 33 applies a suitable negative potential to collector 19 over a direct current path composed of a portion of primary winding 23, tap 26 and a decoupling resistor 34, while the emitter 18 is connected to the positive battery terminal through a direct current path which includes the parallel combination of serially connected resistors 35 and 36 and a potentiometer 37. The secondary winding 13 and a resistor 38 provide a direct current path between the base 21 and the negative battery terminal. Forward bias for the emitter-base junction of transistor 17 is determined by the resistors 35, 36 and 38 serially connected with the base-emitter junction to the battery. It will be noted that a voltage, the average D.C. level of which is a function of signal strength, is developed across the resistor 32. This voltage is applied by way of the resistors 39 and 41 to control the average emitter-base bias voltage as a function of signal level. The resistor 41 is returned to the junction of the resistors 35 and 36 in the emitter circuit of the transistor 17. The resistor 35 is in the D.C. input circuit and provides sufficient D.C. degeneration so that large changes in the average D.C. voltage across the resistor 32 will not move the transistor 17 operating point far enough to cause distortion, while retaining the advantages of some internal AGC action. The D.C. degenerative action of the resistor 35 also serves to compensate for operational variations of individual transistors to permit transistor interchangeability in the stage.

To improve sensitivity and reduce distortion at low input signal levels a forward bias is applied to diode 29 of the detector circuit by a bleeder network connected across battery 33 which includes resistors 38, 39, 32, 41 and 36. Potentiometer 37, which operates as a volume control, is made considerably larger than the total resistance of resistors 35 and 36 to limit the direct current flow therethrough thereby to reduce the susceptibility thereof to noisy operation, and, therefore, has no disturbing influence on the biasing potentials applied to the transistor electrodes.

Upon application of an incoming intermediate frequency signal to input terminals 15, and the subsequent amplification and detection thereof, a demodulated, or audio frequency, signal having a D.-C. component is developed across resistor 32 of a polarity which opposes and tends to decrease the quiescent forward bias between the emitter and base electrodes thereby reducing the gain of the high frequency portion of the reflex amplifier. The average value of the demodulated signal developed by the detector circuit therefore provides internal AGC action for the reflex amplifier which varies the gain of the reflex amplifier to the incoming signal inversely with the strength thereof. Resistor 35 is degenerative to the AGC signal developed across resistor 32 and tends to suitably regulate the internal AGC action.

If the development of an external AGC is desired for application to the preceding amplifier or converter stages of the receiver, an AGC output circuit composed of an audio frequency filter capacitor 42 and a decoupling resistor 43 may be connected at the juncture 44. To prevent the AGC circuit from loading the audio portion of the reflex amplifier, resistor 43 is preferably much larger than the total series resistance of resistors 35 and 36. The AGC signal available at juncture 44 is of a larger magnitude than that which may be derived from the resistor 32 since the detector circuit is directly coupled to the input electrodes of the reflex amplifier and an amplified D.C. signal is obtained across the series resistors 35 and 36.

The demodulated, or audio, signal developed across resistor 32 is also applied between the base 21 and emitter

18 electrodes of transistor 17 for reamplification over a circuit path dependent upon the setting of volume control potentiometer 37. When maximum audio gain is desired from the stage, the potentiometer wiper is effectively positioned at juncture 44 whereupon the audio signal is A.C. coupled to the transistor input electrodes over a circuit path which includes secondary winding 13, resistor 39 and audio frequency bypass capacitor 45. In this setting, all of the potentiometer 37 is in the output circuit and the maximum audio signal is developed across the audio load impedance in the transistor collector circuit consisting of the entire parallel combination of potentiometer 37, the series connected resistors 35 and 36 and the input impedance of the succeeding stages coupled to the reflex amplifier stage signal output circuit 46. The audio output signal in circuit 46 is developed across the impedance of potentiometer 37 between the wiper and the end thereof connected to ground. As the wiper descends, an increasing amount of unbypassed resistance is introduced into the input circuit of the audio frequency portion of the reflex amplifier which degenerates the applied audio signal. Furthermore, the reduced volume control setting also decreases the impedance across which the amplified audio signal is developed in the output circuit 46. At the minimum volume control setting, the wiper is at the grounded side of the potentiometer and optimum audio degeneration occurs. The grounded wiper also prevents the development of an audio signal in the output circuit 46, thus eliminating the "play through" effect. The audio gain reduction resulting from the degeneration insures against audio frequency overloading of the reflex amplifier at all input signal levels before the succeeding stages of the receiver limit severely, and, in addition, by increasing the A.C. input impedance to the detector circuit, the audio frequency loading on the detector circuit is reduced and detector distortion considerably decreased.

It is to be noted that since potentiometer 37 is A.C. coupled to the detector circuit, it has no influence on the forward bias applied to the emitter and base electrodes, thus, both the internal and external AGC signal developed in the stage is independent of volume control settings.

While a specific embodiment and application of the invention has been disclosed in detail to illustrate the inventive principle, it will be understood that the reflex amplifier stage of the present invention may be embodied otherwise without departure from such principles.

What is claimed is:

1. A reflex amplifier stage for amplifying a first and second signals in different frequency bands comprising an amplifier device having an input electrode, an output electrode and a common electrode, an input circuit for said first signals coupled between said input and common electrodes, an output circuit for said first signals coupled between said output and common electrodes, variable impedance means for said second signals connected between said output and common electrodes, an input circuit for said second signals connected between said input and common electrodes and including a variable portion of said impedance means, and an output circuit for said second signals connected across the remaining portion of said impedance means.

2. In a radio signal receiver, a reflex amplifier stage for simultaneously amplifying a signal modulated carrier wave and a demodulated signal derived therefrom, comprising an amplifier device having an input electrode, an output electrode and a common electrode, an input circuit for said signal modulated carrier wave coupled between said input and common electrodes, an output circuit for said signal modulated carrier wave coupled between said output and common electrodes, a detector circuit coupled to said output circuit for deriving a demodulated signal from said signal modulated carrier wave, an unbypassed resistive network including a variable resistor having a movable tap thereon connected between said output and common electrodes, means for applying said demodulated signal between said input electrode and the tap on said resistor, and output circuit means for said demodulated signal connected between said output electrode and said tap.

3. A reflex amplifier stage comprising circuit means for amplifying a modulated carrier signal, detector means for deriving a demodulated signal from said modulated carrier signal, means for feeding back said demodulated signal to said circuit means for amplification, output circuit means for said demodulated signal subsequent to the amplification thereof, said feeding back means including variable impedance means introducing an increasing degenerative impedance in said circuit means thereby reducing the amplification of said demodulated signal as said impedance means is varied in one direction, and simultaneously therewith, decreasing the magnitude of the impedance across which the amplified demodulated signal is developed for said output circuit means.

4. A reflex amplifier stage comprising circuit means for amplifying a modulated carrier signal, detector means coupled to said circuit means for deriving a demodulated signal from said modulated carrier signal subsequent to the amplification thereof, means for feeding back said demodulted signal to said circuit means for amplification, output means for said demodulated signal subsequent to the amplification thereof, said feeding back means including variable impedance means introducing an increasing degnerative impedance in said circuit means thereby reducing the amplification of said demodulated signal as said impedance means is varied in one direction, and simultaneously therewith, decreasing the magnitude of the impedance across which said demodulated signal is developed for said output means, and means responsive to said demodulated signal for controlling the amplification of said modulated carrier signal by said circuit means.

5. A reflex amplifier stage comprising an amplifying device having input electrodes and output electrodes, input circuit means connected for applying a modulated carrier signal to said input electrodes, output circuit means coupled to said output electrodes across which an amplified modulated carrier signal is developed, detector circuit means coupled to said output circuit means for developing a demodulated signal from the amplified modulated carrier signal, means for feeding back said demodulated signal to said input electrodes for reamplification, output circuit means for the reamplified demodulated signal, said feeding back means including variable impedance means introducing an increasing degenerative impedance between said input electrodes thereby reducing the magnitude of said reamplification as said impedance means is varied in one direction, and concurrently therewith, decreasing the magnitude of the impedance thereof across which said reamplified demodulated signal is developed for said output circuit means.

6. A reflex amplifier stage according to claim 5, and including circuit means coupled between said input electrodes and said detector circuit means for regulating the amplification of said modulated carrier signal by said amplifying device.

7. A reflex amplifier stage comprising an amplifying device having input electrodes and output electrodes, input circuit means connected for applying a modulated carrier signal to said input electrodes, output circuit means coupled to said output electrodes across which an amplified modulated carrier signal is developed, detector circuit means for deriving a demodulated signal from said amplified modulated carrier signal, means for feeding back said demodulated signal to said input electrodes for reamplification, said feeding back means including an impedance connected to said output electrodes and having a movable tap thereon coupled to said detector circuit means, and output circuit means for said demodulated signal, movement of said tap in one direction inserting an increasing degenerative impedance between said input electrodes thereby reducing the magnitude of said reamplification, and concurrently therewith, reducing the magnitude of the remaining impedance thereof across which said demodulated signal is applied to said output circuit means.

8. A reflex amplifier stage according to claim 7, and including circuit means responsive to said demodulated signal connected between said input electrodes and said detector circuit means for regulating the magnitude of the potential across said input electrodes thereby regulating the amplification of said modulated carrier signal by said amplifying device.

9. A reflex amplifier stage comprising a semiconductor device having an input electrode, an output electrode and a common electrode, an input circuit connected for applying a modulated carrier signal between said input and common electrodes, direct current conductive means including a source of energizing potential for impressing suitable biasing potentials to said electrodes, an output circuit connected between said output and common electrodes across which an amplified modulated carrier signal is developed, a detector circuit coupled to said output circuit for developing a demodulated signal from said amplified modulated carrier signal, circuit means including a bypassing capacitor coupled between said input and common electrodes and said detector circuit for feeding back said demodulated signal for reamplification, said circuit means including a variable impedance having a movable tap thereon connected to said capacitor, one extremity of said impedance being connected to said input electrodes, the other extremity of said impedance and said tap forming an output circuit for said demodulated signal, movement of said tap in one direction inserting an increasing magnitude of unbypassed impedance between said input and common electrodes degenerative to said demodulated signal, and concurrently therewith, reducing the remaining magnitude of bypassed impedance across which said demodulated signal is developed in said output circuit.

10. A reflex amplifier stage according to claim 9, and including circuit means coupling said detector circuit between said input and common electrodes for automatically regulating the bias potential therebetween in accordance with the magnitude of said demodulated signal.

11. A reflex amplifier stage comprising a transistor having base, emitter and collector electrodes, a tuned input network connected for applying an incoming modulated carrier signal to said base and emitter electrodes, a tuned output network connected between said emitter and collector electrodes across which said amplified modulated carrier signal is developed, a source of energizing potential, a first direct current conductive path including a first resistive element and a portion of said tuned output network connecting said collector electrode to said source, a second direct current conductive path including second and third resistive elements connecting said emitter electrode to said source, a detector circuit inductively coupled to said output network for developing a demodulated signal from said amplified carrier signal, a third direct current conductive path connecting one side of said detector circuit to said base electrode, a variable impedance element connected across said second and third resistive elements and having a movable tap thereon capacitively coupled to the other side of said detector circuit for feeding back, in conjunction with said third direct current conductive path, the demodulated signal from said detector circuit to said base and emitter electrodes for reamplification, an output circuit connected to said variable impedance element, said variable impedance element adding an increasing magnitude of degenerative impedance between said emitter and base electrodes as the tap thereof is selectively varied in one direction thereby reducing th magnitude of amplification of said demodulated signal, and concurrently therewith, decreasing the magnitude of impedance across which the reamplified demodulated signal is applied to said output circuit, and a fourth direct current conductive path including said second resistive element and a fourth resistive element connected between said other side of said detector circuit and said second and third resistive elements, said third and fourth paths providing control of the forward bias between said base and emitter electrodes by said demodulated signal thereby automatically regulating the magnitude of said amplified modulated carrier signal, said forward bias control being independent of the selective variation of the setting of said variable impedance element.

12. A reflex amplifier according to claim 11 having circuit means including a capacitor connected across said collector and base electrodes for effecting neutralization of said transistor.

13. A reflex amplifier according to claim 11, having output circuit means connected across said second and third resistive elements for providing an external automatic gain control potential correlative to the magnitude of said demodulated signal.

14. A reflex amplifier according to claim 11 wherein said tuned input network and said tuned output network are resonant at substantially the same frequency.

References Cited in the file of this patent

UNITED STATES PATENTS

| | | |
|---|---|---|
| 2,086,195 | Smith | July 6, 1937 |
| 2,204,975 | Thierbach | June 18, 1940 |

FOREIGN PATENTS

| | | |
|---|---|---|
| 152,511 | Australia | July 26, 1931 |

OTHER REFERENCES

Philco Transistor Data Sheet, T1690, July 1959.